(12) United States Patent
Chavali et al.

(10) Patent No.: US 11,196,165 B2
(45) Date of Patent: Dec. 7, 2021

(54) LOW Z-HEIGHT, ULTRA-LOW DIELECTRIC CONSTANT AIR CAVITY BASED AND MULTI-CORE/HIGHLY ASYMMETRIC ANTENNA SUBSTRATE ARCHITECTURES FOR ELECTRICAL PERFORMANCE IMPROVEMENTS IN 5G MM-WAVE APPLICATIONS

(71) Applicant: Intel Corporation, Santa Clara, CA (US)

(72) Inventors: Sri Chaitra Chavali, Chandler, AZ (US); Siddharth Alur, Chandler, AZ (US); Sheng Li, Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 654 days.

(21) Appl. No.: 16/017,093

(22) Filed: Jun. 25, 2018

(65) Prior Publication Data

US 2019/0393606 A1      Dec. 26, 2019

(51) Int. Cl.
*H01Q 9/04* (2006.01)
*H01L 23/66* (2006.01)
*H01Q 5/35* (2015.01)
*H01Q 1/22* (2006.01)

(52) U.S. Cl.
CPC ........... *H01Q 9/0414* (2013.01); *H01L 23/66* (2013.01); *H01Q 1/2283* (2013.01); *H01Q 5/35* (2015.01); *H01Q 9/0435* (2013.01); *H01L 2223/6677* (2013.01)

(58) Field of Classification Search
CPC ...... H01Q 9/0414; H01Q 9/0435; H01Q 5/35; H01Q 1/2283; H01L 23/66; H01L 2223/6677
USPC ................................... 343/700 MS
See application file for complete search history.

(56) References Cited

U.S. PATENT DOCUMENTS 7,050,004 B2 * 5/2006 Shafai ............... H01Q 1/243
343/700 MS
7,636,063 B2 * 12/2009 Channabasappa ... H01Q 9/0442
343/700 MS

* cited by examiner

*Primary Examiner* — Khai M Nguyen
(74) *Attorney, Agent, or Firm* — Schwabe, Williamson & Wyatt, P.C.

(57) ABSTRACT

Embodiments include antennas, methods of forming antennas, and a semiconductor package. An antenna includes a feed port disposed in a substrate, and the feed port having a first patch and a second patch. The first patch is disposed on a top surface of substrate, and the second patch is disposed on a bottom surface of substrate. The antenna includes a photoimageable dielectric (PID) disposed on the bottom surface of substrate, where PID surrounds the second patch. The antenna includes a third patch disposed on PID, where the third patch is below the second patch. The antenna includes a cavity disposed between the second and third patches, where the cavity is enclosed by PID and third patch. An additional antenna includes a patch disposed on a first substrate, and a feed port disposed in a second substrate. This antenna includes a composite layer disposed between the first and second substrates.

25 Claims, 6 Drawing Sheets

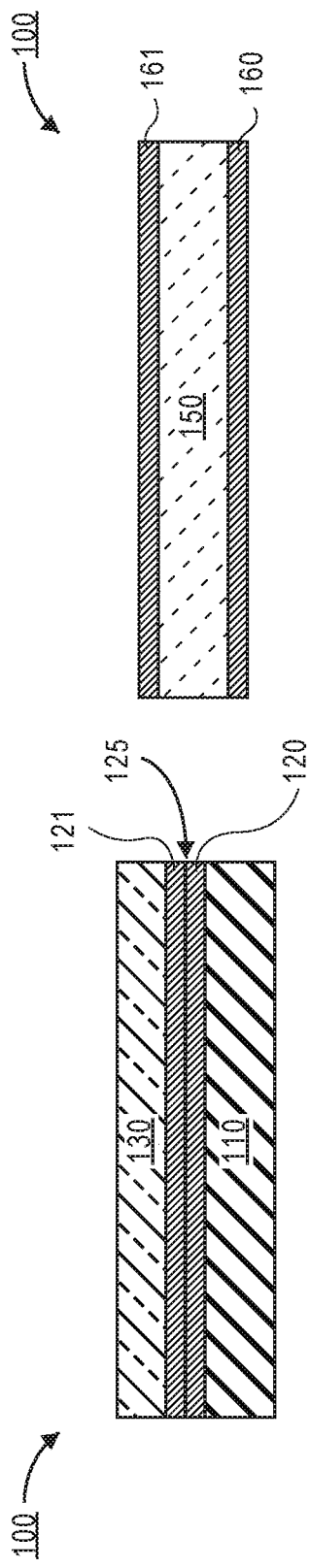
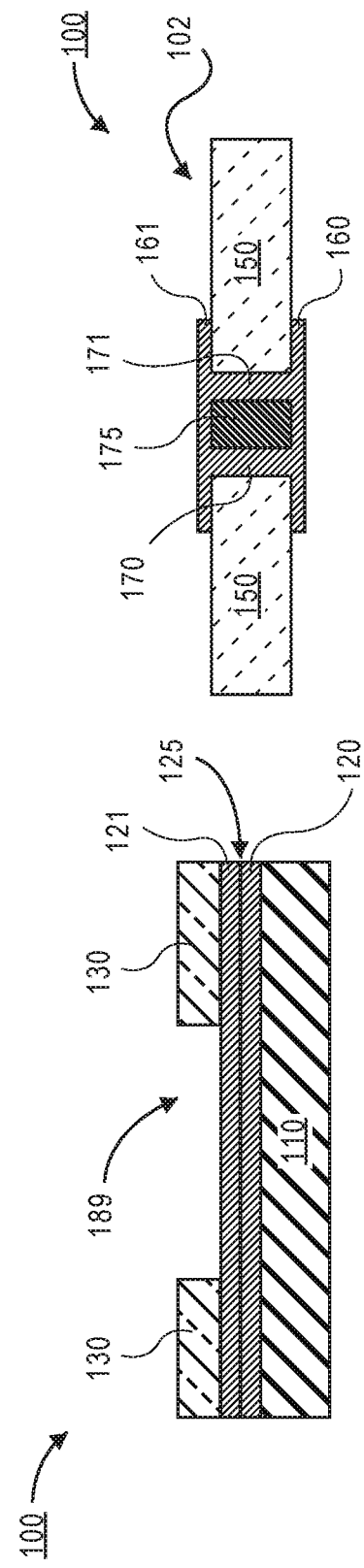
FIG. 1A
FIG. 1B
FIG. 1C
FIG. 1D

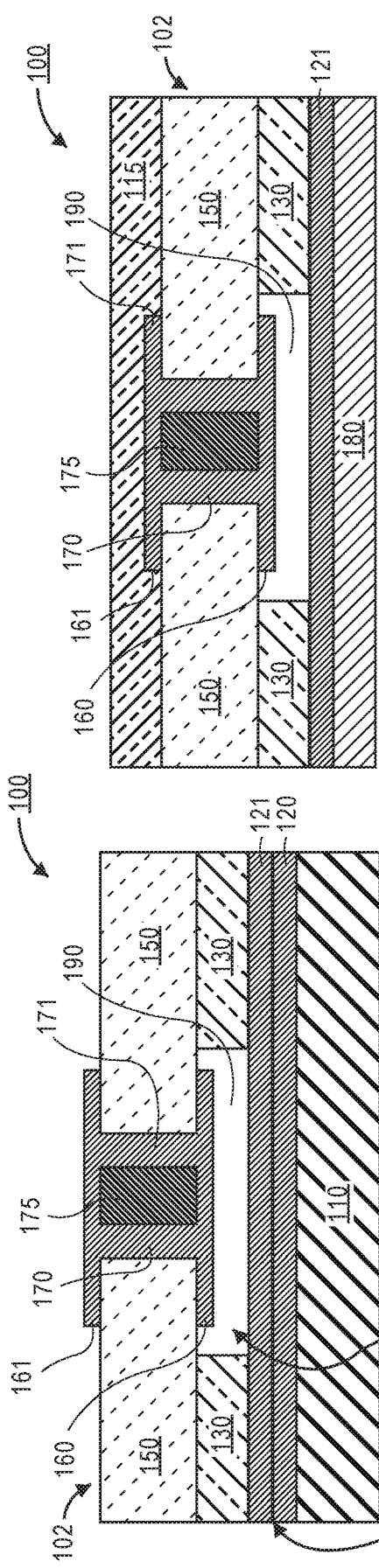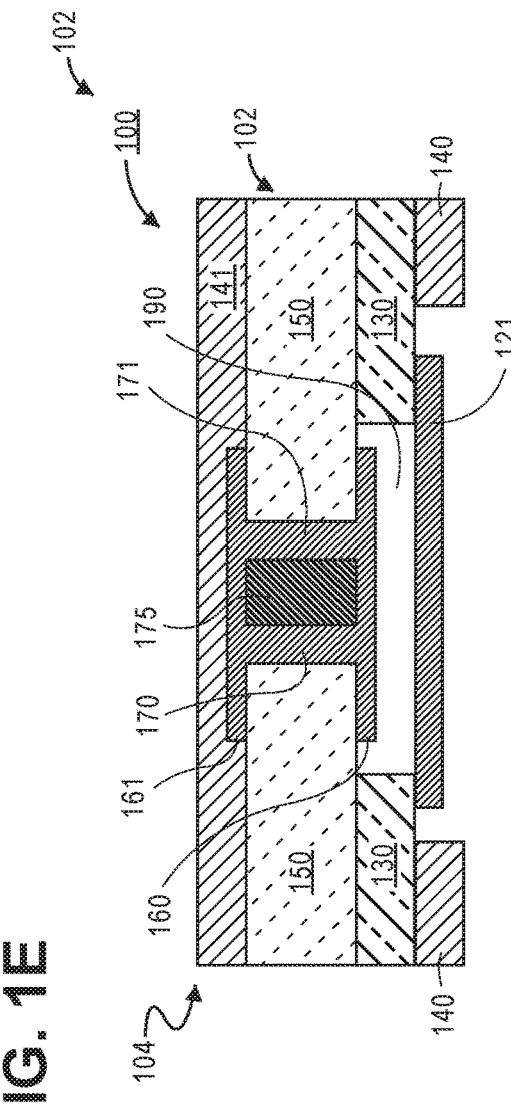

LOW Z-HEIGHT, ULTRA-LOW DIELECTRIC CONSTANT AIR CAVITY BASED AND MULTI-CORE/HIGHLY ASYMMETRIC ANTENNA SUBSTRATE ARCHITECTURES FOR ELECTRICAL PERFORMANCE IMPROVEMENTS IN 5G MM-WAVE APPLICATIONS

FIELD

Embodiments relate to packaging semiconductor devices. More particularly, the embodiments relate to antenna substrate architectures having air cavities and multi-core/highly asymmetric substrates and methods for forming such antennas.

BACKGROUND

Packaging of semiconductor devices present several problems. One of the main problems involves designing an antenna substrate with improved electrical performance without compromising the form-factor of the packaged system. This conflict typically causes the package system to compromise between optimizing communication systems or decreasing the overall z-height.

Antenna subtrates require dielectric materials with a low dielectric constant (Dk) and a low dielectric loss (Df), which help improve the antenna's performance when used in 5G architectures. These dielectric materials, however, have very low wettability and adhesion due to the low level of polar molecules present. As such, these dielectric materials cannot be patterned, plated, nor processed using existing plating equipment. Additional disadvantages of using dielectric materials with low Dk and Df polymers include higher costs, complex process flows, thicker substrates, and compromised electrical performances.

Another problem involves manufacturing obstacles encountered with highly asymmetric antenna designs at the assembly level of 5G mm-wave architecture. Existing approaches to antenna designs include a high layer count of coreless substrates or a symmetric build architecture that compromises the electrical performance, the lead time, and z-height. These existing approaches have various constraints, such as higher costs due to excessive unnecessary layers within the substrates, complex process flows, thicker substrates, and compromised electrical performances.

BRIEF DESCRIPTION OF THE DRAWINGS

Embodiments described herein illustrated by way of example and not limitation in the figures of the accompanying drawings, in which like references indicate similar features. Furthermore, some conventional details have been omitted so as not to obscure from the inventive concepts described herein.

FIGS. 1A-1G are cross-sectional views of a process flow to form an antenna having a feed port substrate, a photoimageable dielectric (PID) layer, a conductive layer, a cavity, and one or more resist layers, according to some embodiments.

DETAILED DESCRIPTION

Described herein are antennas with air cavities and multi-core/highly asymmetric substrates and a method of forming such antennas. In particular, for some embodiments, the antennas described below and methods of forming such antennas include an air cavity created between photoimageable dielectric (PID) layer(s), and/or a composite layer disposed between a feed port substrate and a patch based substrate as the composite layer attaches the patch based substrate to the feed port substrate.

According to some embodiments, an antenna is described (e.g., the antenna 100 shown in FIG. 1G). For one embodiment, the antenna includes a feed port disposed in a substrate (also referred to as a feed port substrate). The feed port may have a first patch and a second patch. The first patch may be disposed on a top surface of the substrate, and the second patch may be disposed on a bottom surface of the substrate. For another embodiment, the antenna also includes a PID layer disposed on the bottom surface of the substrate. The PID layer may be patterned to form an opening that surrounds the second patch. In one embodiment, the antenna further includes a third patch disposed on a bottom surface of the PID. The third patch may be positioned below the second patch. For one embodiment, the third patch has a footprint that is greater than a footprint of the second patch. According to one embodiment, the antenna includes an air cavity disposed (or formed) between the third patch and the second patch. The air cavity may be disposed in the PID layer and enclosed by the PID layer, the second patch, and the third patch. Note that the air cavity may also be enclosed by the bottom surface of the substrate.

Figure 2A:
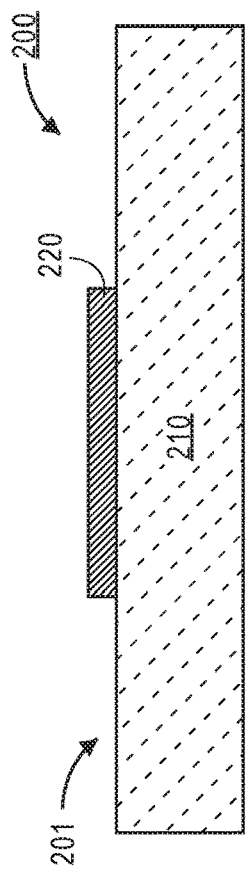
FIGS. 2A-2C are cross-sectional views of a process flow to form an antenna having a feed port substrate, a composite layer, and a patch based substrate, according to some embodiments.
Figure 2B:
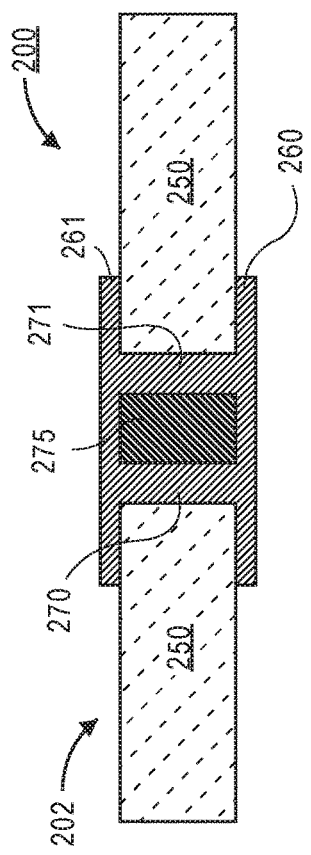
Figure 2C:
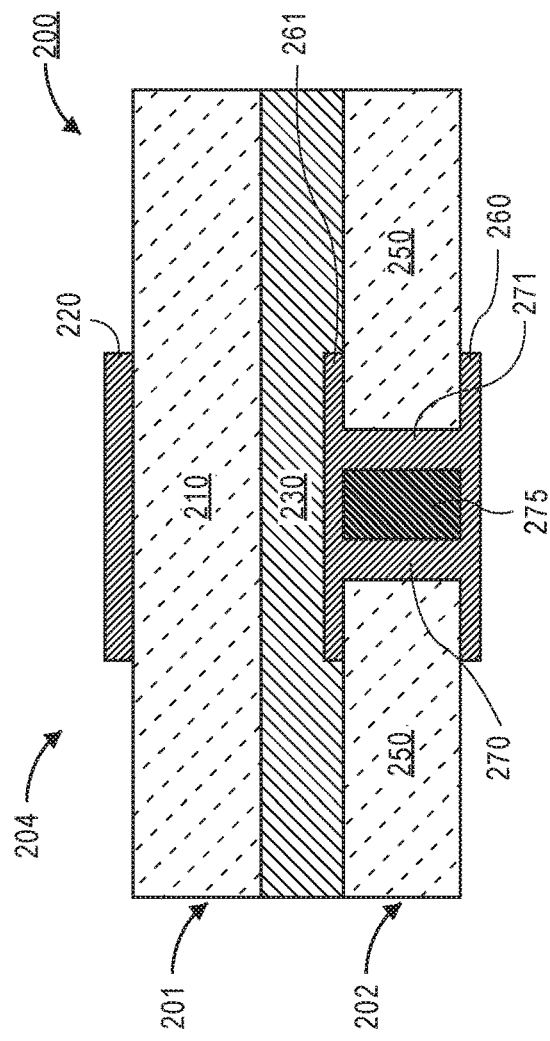

According to other embodiments, a second antenna is described (e.g., the antenna 200 shown in FIG. 2C). For one embodiment, the second antenna includes a patch on a first substrate (also referred to as a patch based substrate). For another embodiment, the second antenna also includes a feed port disposed in a second substrate. The feed port may have a first patch and a second patch. The first patch may be disposed on a top surface of the second substrate, and the second patch may be disposed on a bottom surface of the second substrate. In one embodiment, the antenna further includes a composite layer disposed between the first substrate and the second substrate. The composite layer may include a core material and a composite ultra-low dielectric constant material. The composite layer may act as an adhesive layer that attaches a bottom surface of the first substrate to the first patch and the top surface of the second substrate.

Accordingly, for these embodiments, the antennas described herein (which may also be referred to as antenna substrates, antenna substrate architectures/designs, antenna assemblies, or antenna modules) enable electrical performance improvements without compromising the form factor of the antennas. An antenna may include a cavity that uses air as a dielectric medium. For one embodiment, the antenna may use photo-definable materials to create (or pattern) the air cavity between a PID layer (e.g., the air cavity 190 disposed between the PID layer 130 as shown in FIG. 1E).

As described above, low dielectric constant (Dk) and dielectric loss (Df) materials typically have very low wettability and adhesion, and thus cannot be patterned and/or processed using existing equipment or existing process flows. In these embodiments, the air in the cavity of the antenna comprises the lowest Dk and Df which remarkably improves electrical performance of the antenna—without incurring higher costs, complex process flows, thicker substrates, and compromised electrical performances. Accordingly, these embodiments facilitate packaging solutions by improving the electrical performances of antennas—without compromising the z-height (or thickness) of the substrate—as a PID layer is patterned to form an opening, and an air cavity is disposed in the patterned opening of the PID layer. These embodiments also improve the communication systems in 5G millimeter-wave (mm-wave) applications and architectures by providing exceedingly higher data rates and lower electrical losses.

Additionally, in some embodiments, the antennas described herein may implement two or more core (or coreless) structures which are attached (or coupled) using a low Dk and Df composite materials, which enables processing 5G architecture structures without any yield loss due to warpage resulting from copper density imbalances. These embodiments also help to increase the performance of the antenna as the signal is transmitted through the patch (or parasitic patch) via the ultra-low Dk and Df composite layer with increased stability and no increase in complexity or processing cost. For one embodiment, the increased stability of the antenna may be attributable to the patch substrate and the feed port substrate having approximately the same z-height and the same materials (i.e., both may be formed of core materials). Another major advantage of the embodiments of the antenna includes reducing (or dissipating) heat by using an air cavity as a barrier to isolate heat from traveling through the antenna (e.g., the air cavity may isolate the heat from the feed port substrate of the antenna).

These embodiments mitigate packaging challenges encountered with highly asymmetric designs at the substrate/assembly level in 5G mm-wave architecture. Other advantages of these embodiments include (i) improving the antenna's performance by using a composite layer comprised of low Dk and Df materials, (ii) facilitating the thickness control of the antenna substrate by implementing core materials, (iii) further improving the antenna's performance by having thickness uniformity, and (iv) decreasing manufacturing costs (or increasing cost-efficiency) by forming the composite layer without requiring any new tools, equipment, or process flows.

The technologies described herein may be implemented in one or more electronic devices. Non-limiting examples of electronic devices that may utilize the technologies described herein include any kind of mobile device and/or stationary device, such as microelectromechanical systems (MEMS) based electrical systems, gyroscopes, advanced driving assistance systems (ADAS), 5G communication systems, cameras, cell phones, computer terminals, desktop computers, electronic readers, facsimile machines, kiosks, netbook computers, notebook computers, internet devices, payment terminals, personal digital assistants, media players and/or recorders, servers (e.g., blade server, rack mount server, combinations thereof, etc.), set-top boxes, smart phones, tablet personal computers, ultra-mobile personal computers, wired telephones, combinations thereof, and the like. Such devices may be portable or stationary. In some embodiments, the technologies described herein may be employed in a desktop computer, laptop computer, smart phone, tablet computer, netbook computer, notebook computer, personal digital assistant, server, combinations thereof, and the like. More generally, the technologies described herein may be employed in any of a variety of electronic devices, including antennas having a feed port substrate, a PID layer, a conductive layer, a cavity, and one or more resist layers.

In the following description, various aspects of the illustrative implementations will be described using terms commonly employed by those skilled in the art to convey the substance of their work to others skilled in the art. However, it will be apparent to those skilled in the art that the present embodiments may be practiced with only some of the described aspects. For purposes of explanation, specific numbers, materials and configurations are set forth in order to provide a thorough understanding of the illustrative implementations. However, it will be apparent to one skilled in the art that the present embodiments may be practiced without the specific details. In other instances, well-known features are omitted or simplified in order not to obscure the illustrative implementations.

Various operations will be described as multiple discrete operations, in turn, in a manner that is most helpful in understanding the present embodiments, however, the order of description should not be construed to imply that these operations are necessarily order dependent. In particular, these operations need not be performed in the order of presentation.

As used herein the terms "top," "bottom," "upper," "lower," "lowermost," and "uppermost" when used in relationship to one or more elements are intended to convey a relative rather than absolute physical configuration. Thus, an element described as an "uppermost element" or a "top element" in a device may instead form the "lowermost element" or "bottom element" in the device when the device is inverted. Similarly, an element described as the "lowermost element" or "bottom element" in the device may instead form the "uppermost element" or "top element" in the device when the device is inverted.

FIGS. 1A-1G are cross-sectional views of a process flow 100 to form an antenna having a feed port substrate 102, a PID layer 130, a conductive layer 121, a cavity 190, and one or more solder resist layers 140-141, according to some embodiments. The process flow 100 illustrated with FIGS. 1A-1B may be implemented in parallel (i.e., these steps may be executed at approximately the same time), and FIGS. 1C-1D may then be implemented in parallel, as well, after FIGS. 1A-1B have been completed. These embodiments as shown with respect to FIGS. 1A-1G provide the process flow 100 that combines a lithographic patterning process and a feed port substrate process to create an air cavity between portions of a PID layer (e.g., the air cavity 190 in/between the PID layer 130 as shown in FIG. 1G).

One such embodiment is illustrated and described based on FIGS. 1A-1G, which illustrates cross-sectional views of an antenna 104 designed/assembled with a feed port substrate 102 disposed on a PID layer 130 which form an air cavity 190 between the feed port substrate 102 and the PID layer 130. In the illustrated embodiments, the patterning and plating of the process flow 100 of the antenna 104 is shown, however it is to be appreciated that the illustrated features are not limiting and may be formed using different processing operations. Note that well-known features of FIGS. 1A-1G are omitted or simplified in order not to obscure the illustrative implementations.

As described herein, regardless of the foregoing technologies and/or bands set forth, antenna embodiments may be exemplified herein with respect to, but not limited to, a long-range wireless communications technology such as an antenna for 5G mm-wave applications, and short-range wireless communications technologies such as the Bluetooth and WiFi technologies as well as a satellite-based communications technology such as GPS that is operable in applicable band(s). The antenna embodiments described below may illustrate one or more antenna assemblies (or antenna substrate architectures) transmitting signals via low Dk and Df layer(s) that may improve, for example, 5G mm-wave packaging designs and electrical performances. In an embodiment, the signals may include a plurality of bands that occupy frequencies between approximately 30 GHz—300 GHz or greater. Embodiments may include frequency bands that provide data rates between approximately 1 Gbps-10 Gbps or greater (e.g., approximately 20 Gbps or greater).

Referring now to FIG. 1A, the process flow 100 illustrates disposing (or laminating) a PID layer 130 on a first conductive layer 121. For one embodiment, the PID layer 130 is disposed on the first conductive layer 121, while the first conductive layer 121 is disposed on a second conductive layer 120 that is disposed on a carrier 110. In one embodiment, the first conductive layer 121 is coupled (or attached) to the second conductive layer 120 with an adhesive layer 125.

For one embodiment, the PID layer 130 may be a high-dose sensitive, positive-tone PID. For another embodiment, the PID layer 130 may be a low-dose sensitive, negative-tone PID. For one embodiment, the PID layer 130 may be deposited with a lamination, spray coating, spin coating, ink-jet printed, or other known deposition methods. Several of the advantages of using PID materials to form the dielectric layer(s) is the reduction of assembly steps (i.e., a single patterning step of a PID layer to form an opening for an air cavity as described below) and their ease of processing (i.e., exposure and subsequent develop to create any structure as defined by a mask).

In one embodiment, the first conductive layer 121 may be formed using a lithographic patterning and deposition process. According to an embodiment, the deposition process may be any suitable deposition process, such as electroless plating or the like. The first conductive layer 121 may formed using any type of conductive material including a copper (Cu) layer (or a Cu seed layer), and/or a combination of one or more conductive materials (or metals), including conductive metals such as tin, lead, nickel, gold, and palladium, or other materials could be used in other embodiments. Also, note, each of the conductive layers (e.g., bottom and top conductive layers 160-161) described herein may include conductive materials including a Cu layer (or a Cu seed layer), and/or a combination of one or more conductive materials (or metals), including conductive metals such as tin, lead, nickel, gold, and palladium, or other materials could be used in other embodiments.

For one embodiment, the carrier 110 may be a removable/releasable carrier (also referred to as a peelable carrier and/or a peelable core). The carrier 110 may be a glass carrier and/or a rigid carrier which can be made from a stainless steel or any rigid (or core) material(s). In one embodiment, the carrier 110 may include the adhesive layer 125 and the second conductive layer 120. The adhesive layer 125 may be disposed on the second conductive layer 120, and the second conductive layer may be disposed on the carrier 110. For one embodiment, the adhesive layer 125 may be an epoxy film, a double-sided release tape, a thermal releasable tape, a UV releasable tape, or the like. Note that the second conductive layer 120 may be similar to the first conductive layer 121 as described above.

FIG. 1B illustrates a substrate 150 having a top conductive layer 161 and a bottom conductive layer 160. As described above, the step of FIG. 1B may be implemented in parallel to the step of FIG. 1A. For one embodiment, the substrate 150 may be a core substrate and a coreless substrate. In some embodiments, the substrate 150 may have a thickness of approximately 60 µm or less. The top conductive layer 161 may be disposed on a top surface of the substrate 150, and the bottom conductive layer 160 may be disposed on a bottom surface of the substrate 150. For one embodiment, the bottom and top conductive layers 160-161 may be formed using a lithographic patterning and deposition process. According to an embodiment, the deposition process may be any suitable deposition process, such as electroless plating or the like. For example, the bottom and top conductive layers 160-161 may formed using any type of conductive material including a Cu layer (or a Cu seed layer), and/or a combination of one or more conductive materials (or metals).

FIG. 1C illustrates the PID layer 130 patterned to form an opening 189 through the PID layer 130 and above the first conductive layer 121. For one embodiment, the PID layer 130 may be patterned using a mask (not shown) (e.g., a multi-tone mask) as a develop step that only removes a PID region/portion that is unexposed to light or has the lowest development dose in the PID layer 130. In one embodiment, the PID layer 130 is printed to have the PID region that vertically extends through the PID layer 130 to a top surface of the first conductive layer 121. As such, after the development of the PID layer 130, the PID region is developed from the PID layer 130 as the PID layer 130 is thus patterned to provide the opening 189 to expose the top surface of the first conductive layer 121 for the formation of an air cavity (e.g., the air cavity 190 as shown in FIG. 1E).

In some embodiments, the opening 189 in the PID layer 130 is exposed and developed based on a desired size of the subsequently formed air cavity. In one embodiment, the opening 189 may have a size of approximately 4 mm×4 mm or smaller. In another embodiment, the opening 189 may have a size of approximately 1 mm×1 mm or smaller. Note that the desired size of the opening 189 (and thus subsequently the size of the air cavity) may be based on the desired packaging design, such as the desired overall form factor (or z-height) and the desired electrical performance of the antenna.

For other embodiments, the PID develop step may be implemented selectively in one or more development steps, as desired, to expose and develop the PID region of the corresponding opening 189. Also, it is to be understood that multiple exposure tools, especially in panel-level manufacturing, are equipped or can be upgraded to allow for exposure with one or more different wavelengths (e.g., between 365 nm and 403 nm). Furthermore, in some embodiments, the remaining regions of the PID layer 130 may be cured using a curing process (e.g., ultra-violet (UV) curing process) or the like. In these embodiments, the elevated temperatures of the cured PID layer 130 may increase (or improve) the adhesion of the PID layer 130 to subsequently couple with the substrate 150 (as shown in FIG. 1E).

FIG. 1D illustrates the substrate 150 patterned and plated to create a feed port substrate 102 (or a feed patch substrate/assembly). As described above, the step of FIG. 1D may be implemented in parallel to the step of FIG. 1C (i.e., steps of FIGS. 1A-1B may be implemented as a first parallel process, and then steps of FIGS. 1C-1D may be implemented as a second parallel process). For one embodiment, the bottom and top conductive layers 160-161 are patterned and plated to dispose a plated through hole (PTH) in the substrate 150, which subsequently creates the feed port substrate 102. For example, a laser/drilling process (i.e., a laser through hole (LTH) process) may be implemented on the substrate 150 to form a via opening, and a PTH process may then be implemented in the via opening to dispose PTH vias 170-171 in the substrate 150 which couple the bottom and top conductive layers 160-161. For one embodiment, the PTH vias 170-171 may be laser-plated vias formed with any convention process, including, for example, an electroless Cu plating process (or the like). For one embodiment, a resin 175 is disposed (or embedded) between the PTH vias 170-171 and the bottom and top conductive layers 160-161.

In one embodiment, after the LTH/PTH/via formation of the substrate 150, the feed port substrate 102 is assembled and includes the substrate 150 as the core/coreless structure of the feed port substrate 102. For one embodiment, the feed port substrate 102 includes a first patch 161 and a second patch 160, where the first patch 161 is on the top surface of the substrate 150, and the second patch 161 is on the bottom surface of the substrate 150. Note that the top conductive layer is the patterned to form the first patch 161, and the bottom conductive layer is patterned to form the second patch 160. For one embodiment, the first and second patches 160-161 (or patch based launchers) may be used as connection points to input/output signals for the antenna (e.g., the antenna 104 of FIG. 1G). Also, in other embodiments, the first and second connections points 160-161 are not limited to patch based launchers and may be disposed to have any other launcher shapes, including circular launchers, tapered launchers, etc. In some embodiments, the first patch 161 has a footprint that is approximately equal to a footprint of the second patch 160. In other embodiments, a footprint of the first patch 161 may be greater than a footprint of the second patch 160. In alternate embodiments, a footprint of the first patch 161 may be less than a footprint of the second patch 160.

FIG. 1E illustrates the substrate 150 of the feed port substrate disposed on the PID layer 130 to form a cavity 190 in the opening 189 of the PID layer 130. For one embodiment, the cavity 190 is an air cavity. In other embodiments, the cavity 190 may include any other dielectric medium that has low Dk and Df properties. According to some embodiments, the air cavity 190 is disposed between the second patch 160 (or the bottom conductive layer) and the first conductive layer 121. In one embodiment, the cavity 190 may have a size of approximately 4 mm×4 mm or smaller. In another embodiment, the cavity 190 may have a size of approximately 1 mm×1 mm or smaller. Note that the desired size of the cavity 190 may be based on the desired packaging design and application, such as the desired overall form factor and the desired electrical performance of the antenna. Also note, in some embodiments, a thickness of the cavity 190 may generally be based on a thickness of the PID layer 130. For example, as these embodiments may utilize thinner photoresists to enable finer/thinner litho-defined features, the cavity 190 may have a thickness of approximately 15+/−2 µm or less if desired (e.g., a specified thickness of the cavity 190 may be needed to establish an optimal performance for the antenna).

For one embodiment, the PID layer 130 may couple the bottom surface of the substrate 150 and the top surface of the first conductive layer 121, and the PID layer 130 may thus surround the second patch 160. Additionally, the PID layer 130 may be further cured using a thermal curing process or the like to improve (or enhance) the adhesion between the substrate 150 of the feed port substrate 102 and the first conductive layer 121.

FIG. 1F illustrates removing both the second conductive layer 120 and the carrier 110 from the first conductive layer 121. In addition, for one embodiment, a photoresist layer 180 may be disposed on the bottom surface of the first conductive layer 121. According to some embodiments, the photoresist layer 180 may be a dry-film photoresist (DFR) or any other resist material(s). For example, the photoresist layer 180 may be formed with any suitable process, such as lamination or slit coating and curing. In other embodiments, a photoresist layer may be disposed on the first patch 161 (or the top conductive layer) and the top surface of the substrate 150 (i.e., the photoresist layer(s) may be disposed on either sides or both sides of the antenna based on the desired packaging design).

In another embodiment, a protective layer 115 (or a protective coating) may be disposed on the first patch 161 (or the top conductive layer) and the top surface of the substrate 150. For one embodiment, the protective layer 115 may be an agent bath, a plating bath, or the like, which may protect the first patch 161 and the substrate 150 from any subsequent lithographic exposure.

FIG. 1G illustrates patterning the photoresist layer 180 (as shown in FIG. 1F) and the first conductive layer 121 to form openings on the bottom surface of the PID layer 130 and a third patch 121. For one embodiment, the first conductive layer is patterned to form the third patch 121, which is positioned below the second patch 160 of the feed port substrate 102. In some embodiments, the third patch 121 has a footprint that is greater than footprints of the second and first patches 160-161. For some embodiments, the third patch 121 has a footprint that is greater than a footprint of the cavity 190. In alternate embodiments, based on the desired packaging design and applications, the antenna 104 may have the cavity 190 disposed below the second patch 160 and a second cavity (e.g., a second air cavity) disposed above the first patch 161 (i.e., applying the same process flow 100 on both sides of the feed port substrate 102). In these embodiments, the cavity 190 may have a footprint that is approximately equal or different than a footprint of the second cavity.

According to an embodiment, the patterning of the photoresist layer 180 may be implemented with lithographic processes (e.g., exposed with a radiation source through a routing layer mask (not shown) and developed with a developer). After the photoresist layer 180 has been patterned, the third patch 121 of the antenna 104 is patterned and formed.

In one embodiment, the protective layer 115 is removed from the first patch 161 and the top surface of the substrate 150. Additionally, the remaining portions of the photoresist layer 180 are stripped, leaving the bottom surface of the PID layer 130 exposed—except the inner edges of the PID layer 130 which are coupled to the third patch 121. For one embodiment, a first solder resist layer 141 is disposed on the first patch 161 and the top surface of the substrate 150, and a second solder resist layer 140 is disposed on the bottom surfaces of the PID layer 130 and the third patch 121. For these embodiments, the first and second solder resist layers 140-141 may include photodefinable materials which may allow the antenna 104 to be implemented (or subsequently coupled) with other electrical structures. In some embodiments, the first and second solder resist layers 140-141 may be a solder mask, a dielectric layer (e.g., a PID layer), or the like.

In one embodiment, the second solder resist layer 140 is patterned to expose the third patch 121, where the remaining portions of the second solder resist layer 140 are disposed on the openings of the bottom surface of the PID layer 130. In some embodiments, after patterning the first conductive layer and the solder resist layer, the antenna 104 is now assembled and may be coupled to any other structure, including a printing circuit board (PCB), a motherboard, a package substrate, and any other semiconductor devices.

These embodiments of the antenna 104 as illustrated in FIG. 1G utilize the cavity 190 to improve the electrical performance of the antenna 104 as the air in the cavity comprises ultra-low dielectric constant and dielectric loss properties. For example, as shown in FIG. 1G, the air cavity 190 may increase the performance of the antenna 104 as the signal is transmitted via air in the air cavity 190, where air as a dielectric medium has the lowest dielectric constant and dielectric loss properties. For example, the assembly of the antenna 104 may be implemented with mm-wave closed or open waveguides (e.g., in the 60-120 GHz frequency bands) to enable exceedingly high data rates and low electrical losses. These embodiments of the antenna 104 may help to provide decreased electrical losses to communication systems (e.g., 5G mm-wave systems) which would further help reduce the latency and increase flexibility. For some embodiments, the air cavity 190 is disposed within a defined thickness of the PID layer 130, and, as such, the formation of the air cavity 190 does not comprise the form factor of the antenna 104 and reduces the z-height of the antenna 104.

Another major advantage of these embodiments of the antenna 104 is reducing (or dissipating) heat by using the air cavity 190 as a barrier to isolate heat from traveling down/up the antenna 104 (e.g., the air cavity 190 may isolate the heat from traveling through the feed port substrate 102 and the third patch 121).

Note that the antenna 104 formed by the process flow 100 of FIGS. 1A-1G may include fewer or additional packaging components based on the desired packaging design.

FIGS. 2A-2C are cross-sectional views of a process flow 200 to form an antenna 204 having a feed port substrate 202, a composite layer 230, and a patch based substrate 201, according to some embodiments. The process flow 200 illustrated with FIGS. 2A-2B may be implemented in parallel (i.e., these steps may be executed at approximately the same time), and FIG. 2C may then be implemented after FIGS. 2A-2B have been completed in parallel. These embodiments as shown with respect to FIGS. 2A-2C provide the process flow 200 that combines a feed port substrate process and a patch based substrate process to create the antenna 204 having an ultra-low dielectric constant composite material (e.g., the composite layer 230 as shown in FIG. 2C).

One such embodiment is illustrated and described based on FIGS. 2A-2C, which illustrates cross-sectional views of an antenna 204 designed/assembled with a patch based substrate 201 disposed above a feed port substrate 202 that are coupled with a composite layer 230. In the illustrated embodiments, the patterning and plating of the process flow 200 of the antenna 204 is shown, however it is to be appreciated that the illustrated features are not limiting and may be formed using different processing operations. Note that well-known features of FIGS. 2A-2C are omitted or simplified in order not to obscure the illustrative implementations.

Referring now to FIG. 2A, the process flow 200 illustrates a feed port substrate 202 that is similar to the feed port substrate 102 described above in FIG. 1D. For one embodiment, the substrate 250 may include a core substrate and a coreless substrate. In some embodiments, the substrate 250 may have a thickness of approximately 60 µm or less. For one embodiment, the feed port substrate 202 includes a first patch 261 and a second patch 260, where the first patch 261 is on a top surface of the substrate 250, and the second patch 261 is on a bottom surface of the substrate 250. For one embodiment, the first and second patches 260-261 (or patch based launchers) may be used as connection points to input/output signals for the antenna (e.g., the antenna 204 of FIG. 2C). In some embodiments, the first patch 261 has a footprint that is approximately equal to a footprint of the second patch 260. In other embodiments, a footprint of the first patch 261 may be greater than a footprint of the second patch 260. In alternate embodiments, a footprint of the first patch 261 may be less than a footprint of the second patch 260.

Additionally, the feed port substrate 202 may include PTH vias 270-271 disposed in the substrate 250 which couple the first and second patches 260-261. For one embodiment, the PTH vias 270-271 may be laser-plated vias formed with any convention process, including, for example, an electroless Cu plating process (or the like). For one embodiment, a resin 275 is disposed (or embedded) between the PTH vias 270-271 and the first and second patches 260-261.

FIG. 2B illustrates a patch based substrate 201. As described above, the step of FIG. 2B may be implemented in parallel to the step of FIG. 2A. For one embodiment, the patch based substrate includes a patch 220 disposed on a substrate 210. In one embodiment, the substrate 210 may include a core substrate and a coreless substrate. In some embodiments, the substrate 210 may have a thickness of approximately 60 µm or less. In other embodiments, the substrate 210 may have a thickness that is different than a thickness of the substrate 250 of FIG. 2A, however the electric performance and stability of the antenna 204 may improve when the thickness of the substrate 210 is approximately equal to the thickness of the substrate 250.

FIG. 2C illustrates a composite layer 230 disposed between the patch based substrate 201 and the feed port substrate 202. For one embodiment, the composite layer 230 couples the patch based substrate 201 onto the feed port substrate 202. In some embodiments, the composite layer 230 is disposed between a bottom surface of the substrate 210 and top surfaces of the substrate 250 and the first patch 261.

In some embodiments, the composite layer 230 includes a composite of low dielectric constant materials. According to these embodiments, the composite layer 230 includes, but is not limited to, a core material and an ultra-low dielectric constant material, where the ultra-low dielectric constant material does not need any patterning and has adhesive properties. In some embodiments, the composite layer 230 may have a Dk value of approximately of 3 or less, and a Df value of approximately of 0.003 or less, where the Dk and Df values are approximately measured at 10 GHz or less. For example, the ultra-low dielectric constant material of the composite layer 230 may include a dielectric material that has a Dk of approximately of 3 or less and a Df value of approximately of 0.003 or less.

For additional embodiments, a first solder resist layer may be disposed on top surfaces of the patch 220 and the substrate 210, and a second solder resist layer may be disposed on bottom surfaces of the substrate 250 and the second patch 260 (e.g., the resist layers may be disposed as similarly illustrated in FIG. 1G). For these embodiments, the first and second solder resist layers may include photodefinable materials which may allow the antenna 204 to be implemented (or subsequently coupled) with other electrical structures. In some embodiments, the first and second solder resist layers may be a solder mask, a dielectric layer (e.g., a PID layer), or the like.

As illustrated in these embodiments, the performance of the antenna 204 improves since the signal is transmitted through the patch 220 (or the parasitic patch) via the composite layer 230—which enables ultra-low dielectric constant properties with no increase in the complexity or the cost of the process flow 200. Furthermore, in 5G mm-wave assemblies, the embodiments of the composite layer 230 may enable two or more highly asymmetric designs (or substrates) to be coupled, while still providing low Dk and Df materials/properties to the antenna. These embodiments of the antenna 204 thus may lead to processing 5G architecture structures without any yield loss due to warpage arising from copper density imbalances. In addition, the embodiments of the antenna 204 facilitate with thickness control as the substrates 201-202 and the composite layer 230 include core materials, which ultimately improves the performance of the antenna 204 by having thickness uniformity.

Note that the antenna 204 formed by the process flow 200 of FIGS. 2A-2C may include fewer or additional packaging components based on the desired packaging design.

Figure 3:
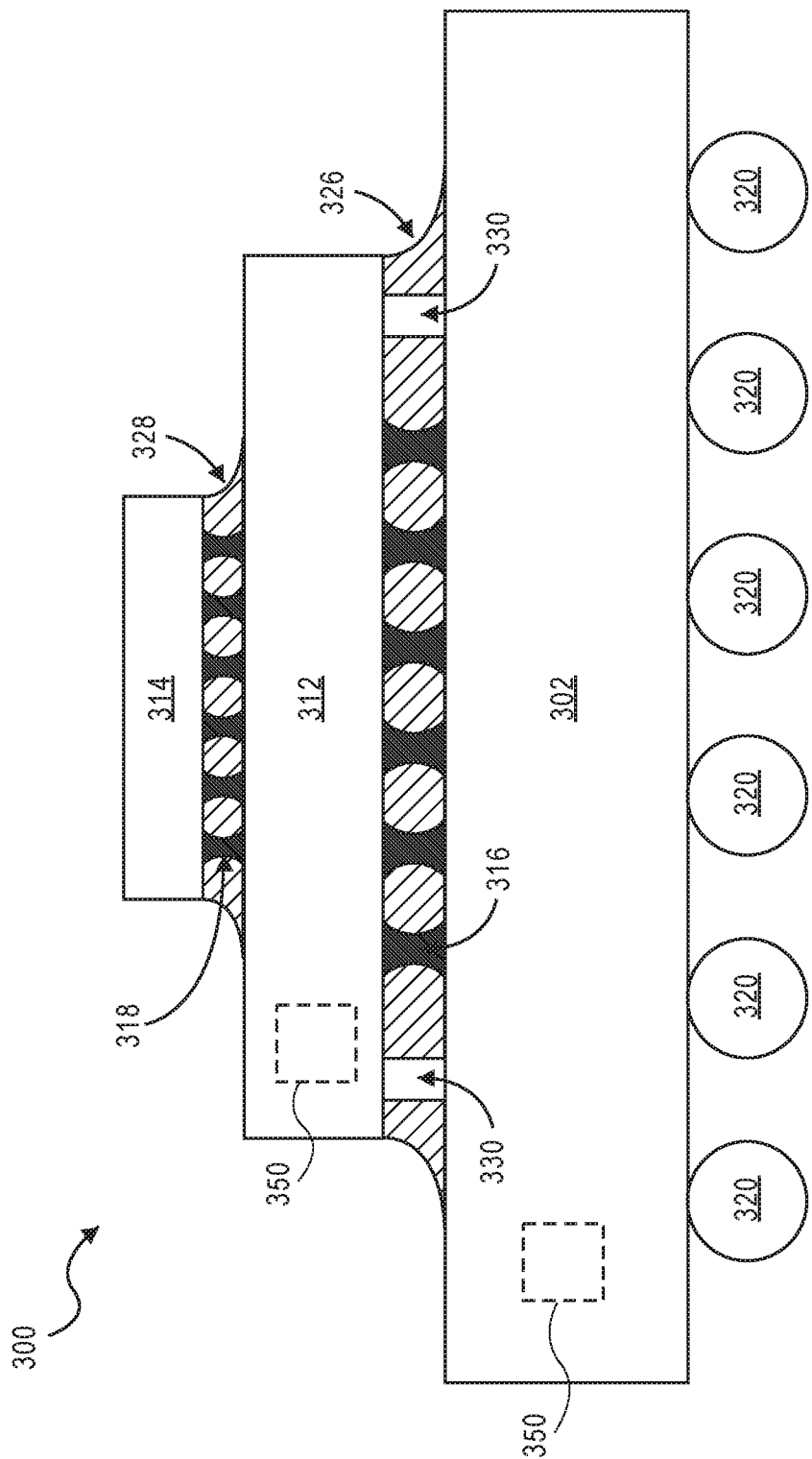
FIG. 3 is a cross-sectional view of a semiconductor packaged system including a die, a substrate, a package substrate, and one or more antennas, according to one embodiment.

FIG. 3 is a cross-sectional view of a semiconductor package 300 including a die 314, a substrate 312 (or an interposer), interconnect structures (e.g., the plurality of bumps disposed below the die 314 and the substrate 312), and a package substrate 302, where the substrate 312 and/or the package substrate 302 may include one or more include antennas (or antenna assemblies) 350 as described herein. For some embodiments, the antennas 350 may include air cavities and/or composite layers with ultra-low Dk and Df properties. Note that the semiconductor package 300 is not limited to the illustrated semiconductor packaged system, and thus may be designed/formed with fewer, alternate, or additional packaging components and/or with different interconnecting structures.

For one embodiment, the semiconductor package 300 may include antennas having an air cavity created between a PID layer and/or a composite layer disposed between a feed port substrate and a parasitic patch based substrate (e.g., as shown with the antenna 104 of FIGS. 1A-1G and the antenna 204 of FIGS. 2A-2C). The embodiments of these antennas enable the semiconductor package 300 to have increased electrical performances by enabling the signal to be transmitted through the air cavity and/or the parasitic patch and thus provide ultra-low Dk and Df properties to the semiconductor package 300. These embodiments of the antennas allow the semiconductor package 300 to have a reduced z-height and a lowered/dissipated heat flow. Note that the package substrate 302 and/or the substrate 312 may be similar to the substrate 150 of FIGS. 1A-1G and the substrates 210 and 250 of FIGS. 2A-2C.

According to one embodiment, the semiconductor package 300 is merely one example of an embodiment of a semiconductor packaged system. For one embodiment, the semiconductor package 300 may include a land grid array (LGA) package and/or a pin grid array (PGA) package. For one embodiment, a die 314 (or an integrated circuit die) is coupled to a substrate 312 (e.g., an interposer) via one or more bumps/joints formed from respective microbumps. As described above, a solder joint formed by soldering of a microbump according to an embodiment may itself be referred to as a "bump" and/or a "microbump." Additionally, for other embodiments, the die 314, the substrate 312, and the package substrate 302 may be coupled using anisotropic conductive film (ACF). For one embodiment, the substrate 312 may be, but is not limited to, a silicon interposer and/or a die with through silicon vias (TSVs). For an alternate embodiment, the semiconductor package 300 may omit the interposer/substrate 312.

For some embodiments, the semiconductor package 300 may have the die 314 disposed on the interposer 312, where both the stacked die 314 and interposer 312 are disposed on a package substrate 302. According to some embodiments, the package substrate 302 may include, but is not limited to, a package, a substrate, a PCB, and a motherboard. For one embodiment, the package substrate 302 is a PCB. For one embodiment, the PCB is made of an FR-4 glass epoxy base with thin copper foil laminated on both sides. For certain embodiments, a multilayer PCB can be used, with pre-preg and copper foil used to make additional layers. For example, the multilayer PCB may include one or more dielectric layers, where each dielectric layer can be a photosensitive dielectric layer. For some embodiments, holes may be drilled in the PCB 302. For one embodiment, the PCB 302 may also include conductive layers that comprise copper lines/traces, metallic pads, vias, via pads, planes, and/or holes.

For one embodiment, the die 314 may include, but is not limited to, a semiconductor die, an electronic device (e.g., a wireless device), an integrated circuit, a central processing unit (CPU), a microprocessor, a platform controller hub (PCH), a memory, and a field-programmable gate array (FPGA). The die 314 may be formed from a material such as silicon and have circuitry thereon that is to be coupled to the interposer 312. Although some embodiments are not limited in this regard, the package substrate 302 may in turn be coupled to another body, for example, a computer motherboard. One or more connections between the package substrate 302, the interposer 312, and the die 314—e.g., including some or all of bumps 316, 318, and 320—may include one or more interconnect structures and underfill layers 326 and 328. In some embodiments, these interconnect structures (or connections) may variously comprise an alloy of nickel, palladium, and tin (and, in some embodiments, Cu).

Connections between the package substrate 302 and another body may be made using any suitable structure, such as the illustrative bumps 320 shown. The package substrate 302 may include a variety of electronic structures formed thereon or therein. The interposer 312 may also include electronic structures formed thereon or therein, which may be used to couple the die 314 to the package substrate 302. For one embodiment, one or more different materials may be used for forming the package substrate 302 and the interposer 312. In certain embodiments, the package substrate 302 is an organic substrate made up of one or more layers of polymer base material, with conducting regions for transmitting signals. In certain embodiments, the interposer 312 is made up of a ceramic base material including metal regions for transmitting signals. Although some embodiments are not limited in this regard, the semiconductor package 300 may include gap control structures 330—e.g., positioned between the package substrate 302 and the interposer 312. Such gap control structures 330 may mitigate a change in the height of the gap between the package substrate 302 and the interposer 312, which otherwise might occur during reflowing while die 314 is attached to interposer 312. Note that the semiconductor package 300 includes an underfill material 328 between the interposer 312 and the die 314, and an underflow material 326 between the package substrate 302 and the interposer 312. For one embodiment, the underfill materials (or layers) 326 and 328 may be one or more polymers that are injected between the layers. For other embodiments, the underfill materials may be molded underfills (MUF).

Note that the semiconductor packaged system 300 may include fewer or additional packaging components based on the desired packaging design.

Figure 4:
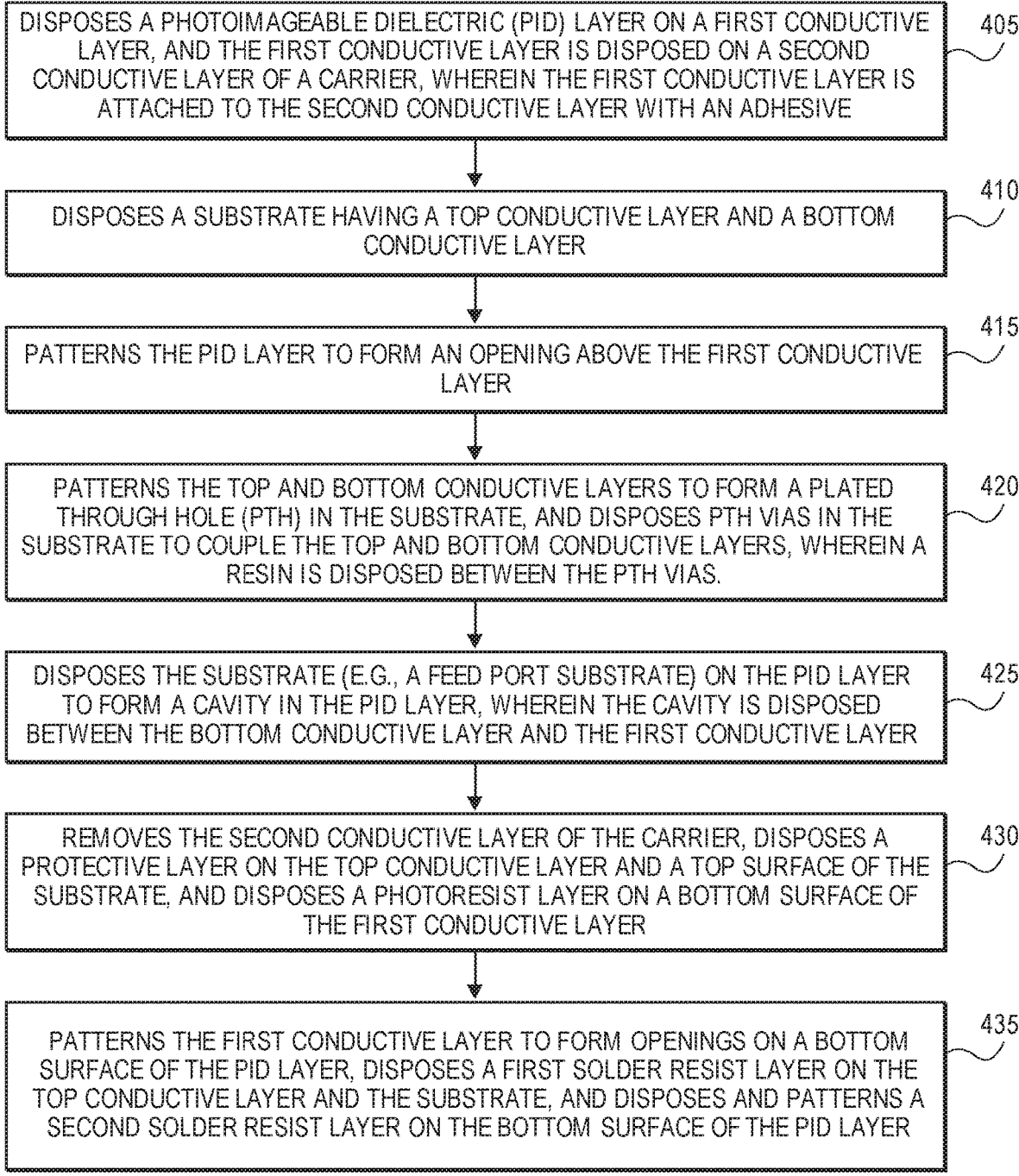
FIG. 4 is a process flow illustrating a method of forming an antenna having a feed port substrate, a PID layer, a conductive layer, a cavity, and one or more resist layers, according to one embodiment.

FIG. 4 is a process flow 400 illustrating a method of forming an antenna having a feed port substrate, a PID layer, a conductive layer, a cavity, and one or more resist layers, according to one embodiment. For one embodiment, the process flow 400 includes one or more steps used to form an antenna as described herein (e.g., the antenna 104 of FIG. 1G). According to one embodiment, the process flow 400 may be similar to the process flow illustrated with FIGS. 1A-1G. Specifically, the process flow 400 may be used to form an antenna having an air cavity disposed between a PID layer which may couple a feed port substrate to a conductive layer (or a patch) (e.g., as shown with the air cavity 190 of FIG. 1G), according to one embodiment.

At block 405, the process flow 400 disposes a PID layer on a first conductive layer, and disposes the first conductive layer on a second conductive layer of a carrier, where the first conductive layer is attached to the second conductive layer with an adhesive (e.g., as shown in FIG. 1A).

At block 410, the process flow 400 disposes a substrate having a top conductive layer and a bottom conductive layer (e.g., as shown in FIG. 1B). In one embodiment, the step of block 410 may be implemented in parallel to the step of block 405. At block 415, the process flow 400 patterns the PID layer to form an opening above the first conductive layer (e.g., as shown in FIG. 1C). At block 420, the process flow 400 patterns the top and bottom conductive layers to form a PTH in the substrate, and disposes PTH vias in the substrate to couple the top and bottom conductive layers (e.g., a first and second patches, respectively), where a resin is disposed between the PTH vias (e.g., as shown in FIG. 1D). In one embodiment, the step of block 420 may be implemented in parallel to the step of block 415.

At block 425, the process flow 400 disposes the substrate (e.g., a feed port substrate) on the PID layer to form a cavity (e.g., an air cavity) in the PID layer, where the cavity is disposed between the bottom conductive layer and the first conductive layer (e.g., as shown in FIG. 1E). At block 430, the process flow 400 removes the second conductive layer and the carrier, disposes a protective layer on the top conductive layer and a top surface of the substrate, and disposes a photoresist layer on a bottom surface of the first conductive layer (e.g., as shown in FIG. 1F). At block 435, the process flow 400 patterns the first conductive layer (e.g., a third patch) to form openings on a bottom surface of the PID layer, removes the protective layer, disposes a first solder resist layer on the top conductive layer and the top surface of the substrate, and disposes and patterns a second solder resist layer on the openings of the bottom surface of the PID layer (e.g., as shown in FIG. 1F).

Note that the antenna formed by process flow 400 may include fewer or additional packaging components based on the desired packaging design.

Additionally, as described above in FIGS. 2A-2C, another process flow may be implemented to form an antenna having a composite layer disposed between a feed port substrate and a patch based substrate, where the composite layer attaches/couples the patch based substrate onto the feed port substrate. For one embodiment, the process flow may use a feed port substrate (similar to the substrate described above at block 420) and a patch based substrate (e.g., as shown in FIG. 2B). In this embodiment, the process flow disposes a composite layer in between the patch based substrate and the feed port substrate, where the composite layer couples the patch based substrate onto the feed port substrate (e.g., as shown in FIG. 2C).

Note that this antenna formed by this additional process flow may include fewer or additional packaging components based on the desired packaging design.

Figure 5:
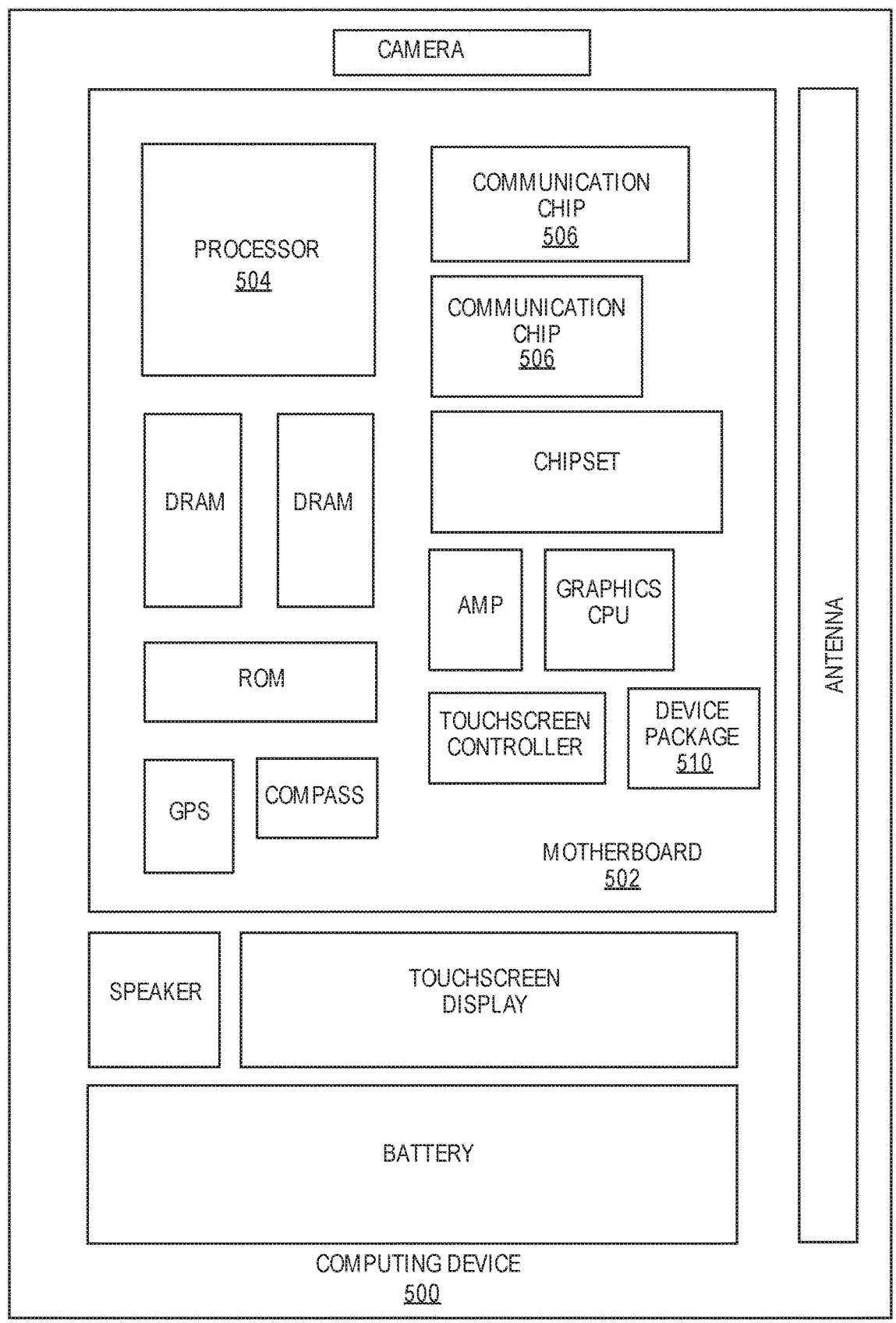
FIG. 5 is a schematic block diagram illustrating a computer system that utilizes an antenna having a feed port substrate, a PID layer, a conductive layer, a cavity, and one or more resist layers, according to one embodiment.

FIG. 5 is a schematic block diagram illustrating a computer system 500 that utilizes an antenna substrate having a feed port substrate, a PID layer, a conductive layer, a cavity, and one or more resist layers, according to one embodiment. FIG. 5 illustrates an example of computing device 500. Computing device 500 houses motherboard 502. For one embodiment, motherboard 502 may be similar to the package substrate 302 of FIG. 3. Motherboard 502 may include a number of components, including but not limited to processor 504, device package 510 (or semiconductor package), and at least one communication chip 506. Processor 504 is physically and electrically coupled to motherboard 502. For some embodiments, at least one communication chip 506 is also physically and electrically coupled to motherboard 502. For other embodiments, at least one communication chip 506 is part of processor 504.

Depending on its applications, computing device 500 may include other components that may or may not be physically and electrically coupled to motherboard 502. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

At least one communication chip 506 enables wireless communications for the transfer of data to and from computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. At least one communication chip 506 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 500 may include a plurality of communication chips 506. For instance, a first communication chip 506 may be dedicated to shorter range wireless communications such as Wi-Fi and Bluetooth and a second communication chip 506 may be dedicated to longer range wireless communications such as GPS, EDGE, GPRS, CDMA, WiMAX, LTE, Ev-DO, and others.

Processor 504 of computing device 700 includes an integrated circuit die packaged within processor 504. Device package 510 may be, but is not limited to, a substrate, a packaging/package substrate, and/or a PCB. Device package 510 may include antennas having an air cavity created between a PID layer and/or a composite layer disposed between a feed port substrate and a parasitic patch based substrate (as illustrated in FIGS. 1-2)—or any other components from the figures described herein—of the computing device 500. Further, as described herein, the device package 510 has increased electrical performances by enabling the signal to be transmitted through the air cavity and/or the parasitic patch which provide ultra-low Dk and Df properties to the device package 510 (e.g., as shown with the antenna 104 of FIGS. 1A-1G and the antenna 204 of FIGS. 2A-2C). The device package 510 may also have a reduced z-height and a lowered/dissipated heat flow by including the antennas described herein.

Note that device package 510 may be a single component/device, a subset of components, and/or an entire system, as the materials, features, and components may be limited to device package 510 and/or any other component of the computing device 500 that may need improved antenna performances (e.g., the motherboard 502, the processor 504, the antenna of the computing device 500, and/or any other component of the computing device 500 that may need improved antenna performances/assemblies as described herein).

For certain embodiments, the integrated circuit die may be packaged with one or more devices on a package substrate that includes a thermally stable RFIC and antenna for use with wireless communications and the device package, as described herein, to reduce the z-height of the computing device. The term "processor" may refer to any device or portion of a device that processes electronic data from registers and/or memory to transform that electronic data into other electronic data that may be stored in registers and/or memory.

At least one communication chip 506 also includes an integrated circuit die packaged within the communication chip 506. For some embodiments, the integrated circuit die of the communication chip may be packaged with one or more devices on a package substrate that includes one or more device packages, as described herein.

In the foregoing specification, embodiments have been described with reference to specific exemplary embodiments thereof. It should be borne in mind, however, that all of these and similar terms are to be associated with the appropriate physical quantities and are merely convenient labels applied to these quantities. It will be evident that various modifications may be made thereto without departing from the broader spirit and scope. The specification and drawings are, accordingly, to be regarded in an illustrative sense rather than a restrictive sense.

The following examples pertain to further embodiments. The various features of the different embodiments may be variously combined with some features included and others excluded to suit a variety of different applications.

The following examples pertain to further embodiments:

Example 1 is a method comprising of a feed port in a substrate, the feed port having a first patch and a second patch. The first patch is on a top surface of the substrate, and the second patch is on a bottom surface of the substrate; a photoimageable dielectric (PID) on the bottom surface of the substrate. The PID surrounds the second patch; a third patch on the PID. The third patch is below the second patch; and a cavity between the second patch and the third patch. The cavity is enclosed by the PID and the third patch.

In example 2, the subject matter of example 1 can optionally include a first resist on the first patch of the feed port and the top surface of the substrate; and a second resist on a bottom surface of the PID. The second resist surrounds the third patch.

In example 3, the subject matter of any of examples 1-2 can optionally include the substrate includes a core substrate and a coreless substrate.

In example 4, the subject matter of any of examples 1-3 can optionally include the feed port further comprising plated through hole (PTH) vias coupled to the first patch and the second path; and a resin disposed between the PTH vias and the first and second patches.

In example 5, the subject matter of any of examples 1-4 can optionally include the third patch having a footprint that is greater than both the first patch and the second patch.

In example 6, the subject matter of any of examples 1-5 can optionally include the cavity as an air cavity.

In example 7, the subject matter of any of examples 1-6 can optionally include the cavity having a footprint that is approximately 4 mm by 4 mm or less.

In example 8, the subject matter of any of examples 1-7 can optionally include the cavity isolating heat from traveling between the second patch and the third patch.

In example 9, the subject matter of any of examples 1-8 can optionally include the first and second resists include photo definable materials.

In example 10, the subject matter of any of examples 1-9 can optionally include the first patch having a footprint that is approximately equal to a footprint of the second patch.

Example 11 is an antenna comprising of a patch on a first substrate; a feed port in a second substrate, the feed port having a first patch and a second patch. The first patch is on a top surface of the second substrate, and the second patch is on a bottom surface of the second substrate; and a composite layer between the first substrate and the second substrate.

In example 12, the subject matter of example 11 can optionally include the composite layer attaches a bottom surface of the first substrate to the first patch of the feed port and the top surface of the second substrate.

In example 13, the subject matter of any of examples 11-12 can optionally include the composite layer which includes a core material and an ultra-low dielectric constant material.

In example 14, the subject matter of any of examples 11-13 can optionally include a first resist on the patch and a top surface of the first substrate; and a second resist on a bottom surface of second substrate and the second patch.

In example 15, the subject matter of any of examples 11-14 can optionally include the first substrate which includes a core substrate and a coreless substrate.

In example 16, the subject matter of any of examples 11-15 can optionally include the second substrate which includes a core substrate and a coreless substrate.

In example 17, the subject matter of any of examples 11-16 can optionally include the feed port which further comprises a plated through hole (PTH) vias coupled to the first patch and the second path; and a resin disposed between the PTH vias and the first and second patches.

In example 18, the subject matter of any of examples 11-17 can optionally include the first substrate having a thickness that is approximately equal to a thickness of the second substrate.

In example 19, the subject matter of any of examples 11-18 can optionally include the composite layer is an adhesive.

In example 20, the subject matter of any of examples 11-19 can optionally include the ultra-low dielectric constant material having a dielectric constant of approximately of 3 or less and a dielectric loss of approximately of 0.003 or less.

In example 21, the subject matter of any of examples 11-20 can optionally include the first and second resists which include photo definable materials.

In example 22, the subject matter of any of examples 11-21 can optionally include the patch having a footprint that is approximately equal to a footprint of the first patch and a footprint of the second patch. The first substrate has a thickness that is equal to a thickness of the second substrate.

Example 23 is a semiconductor package comprising of an interposer on a substrate; and a die on the interposer; and at least one of a first antenna and a second antenna on the substrate.

In example 24, the subject matter of example 23 can optionally include the first antenna which further comprises a feed port in a substrate, the feed port having a first patch and a second patch. The first patch is on a top surface of the substrate, and the second patch is on a bottom surface of the substrate; a photoimageable dielectric (PID) on the bottom surface of the substrate. The PID surrounds the second patch and a third patch on the PID. The third patch is below the second patch; and a cavity between the second patch and third patch. The cavity is enclosed by the PID and the third patch.

In example 25, the subject matter of any of examples 23-24 can optionally include the second antenna which further comprises a patch on a first substrate; a feed port in a second substrate, the feed port having a first patch and a second patch. The first patch is on a top surface of the second substrate, and the second patch is on a bottom surface of the second substrate; and a composite layer between the first substrate and the second substrate.

In the foregoing specification, methods and apparatuses have been described with reference to specific exemplary embodiments thereof. It will be evident that various modifications may be made thereto without departing from the broader spirit and scope. The specification and drawings are, accordingly, to be regarded in an illustrative sense rather than a restrictive sense.

What is claimed is:

1. An antenna, comprising:
   a feed port in a substrate, the feed port having a first patch and a second patch, wherein the first patch is on a top surface of the substrate, and the second patch is on a bottom surface of the substrate;
   a photoimageable dielectric (PID) on the bottom surface of the substrate, wherein the PID surrounds the second patch;
   a third patch on the PID, wherein the third patch is below the second patch; and
   a cavity between the second patch and the third patch, wherein the cavity is enclosed by the PID and the third patch.

2. The antenna of claim 1, further comprising:
   a first resist on the first patch of the feed port and the top surface of the substrate; and
   a second resist on a bottom surface of the PID, wherein the second resist surrounds the third patch.

3. The antenna of claim 1, wherein the substrate includes a core substrate and a coreless substrate.

4. The antenna of claim 1, wherein the feed port further comprises:
   plated through hole (PTH) vias coupled to the first patch and the second path; and
   a resin disposed between the PTH vias and the first and second patches.

5. The antenna of claim 1, wherein the third patch has a footprint that is greater than both the first patch and the second patch.

6. The antenna of claim 1, wherein the cavity is an air cavity.

7. The antenna of claim 1, wherein the cavity has a footprint that is approximately 4 mm by 4 mm or less.

8. The antenna of claim 1, wherein the cavity isolates heat from traveling between the second patch and the third patch.

9. The antenna of claim 2, wherein the first and second resists include photodefinable materials.

10. The antenna of claim 1, wherein the first patch has a footprint that is approximately equal to a footprint of the second patch.

11. An antenna, comprising:
    a patch on a first substrate;
    a feed port in a second substrate, the feed port having a first patch and a second patch, wherein the first patch is on a top surface of the second substrate, and the second patch is on a bottom surface of the second substrate; and
    a composite layer between the first substrate and the second substrate.

12. The antenna of claim 11, wherein the composite layer attaches a bottom surface of the first substrate to the first patch of the feed port and the top surface of the second substrate.

13. The antenna of claim 11, wherein the composite layer includes a core material and an ultra-low dielectric constant material.

14. The antenna of claim 11, further comprising:
    a first resist on the patch and a top surface of the first substrate; and
    a second resist on a bottom surface of second substrate and the second patch.

15. The antenna of claim 11, wherein the first substrate includes a core substrate and a coreless substrate.

16. The antenna of claim 11, wherein the second substrate includes a core substrate and a coreless substrate.

17. The antenna of claim 11, wherein the feed port further comprises:
    plated through hole (PTH) vias coupled to the first patch and the second path; and
    a resin disposed between the PTH vias and the first and second patches.

18. The antenna of claim 11, wherein the first substrate has a thickness that is approximately equal to a thickness of the second substrate.

19. The antenna of claim 11, wherein the composite layer is an adhesive.

20. The antenna of claim 13, wherein the ultra-low dielectric constant material has a dielectric constant of approximately of 3 or less and a dielectric loss of approximately of 0.003 or less.

21. The antenna of claim 14, wherein the first and second resists include photodefinable materials.

22. The antenna of claim 11, wherein the patch has a footprint that is approximately equal to a footprint of the first patch and a footprint of the second patch, and wherein the first substrate has a thickness that is equal to a thickness of the second substrate.

23. A semiconductor package, comprising:
    an interposer on a substrate; and
    a die on the interposer; and at least one of a first antenna and a second antenna on the substrate.

24. The semiconductor package of claim 23, wherein the first antenna further comprises:
- a feed port in a substrate, the feed port having a first patch and a second patch, wherein the first patch is on a top surface of the substrate, and the second patch is on a bottom surface of the substrate;
- a photoimageable dielectric (PID) on the bottom surface of the substrate, wherein the PID surrounds the second patch;
- a third patch on the PID, wherein the third patch is below the second patch; and
- a cavity between the second patch and the third patch, wherein the cavity is enclosed by the PID and the third patch.

25. The semiconductor package of claim 24, wherein the second antenna further comprises:
- a patch on a first substrate;
- a feed port in a second substrate, the feed port having a first patch and a second patch, wherein the first patch is on a top surface of the second substrate, and the second patch is on a bottom surface of the second substrate; and
- a composite layer between the first substrate and the second substrate.

* * * * *